United States Patent
Isozaki

Patent Number: 5,610,440
Date of Patent: Mar. 11, 1997

[54] SEMICONDUCTOR DEVIDE HAVING IMPROVED JUNCTION CONSTRUCTION BETWEEN HEAT RADIATION PLATE AND CERAMIC SUBSTRATE

[75] Inventor: Seiya Isozaki, Tokyo, Japan

[73] Assignee: NEC Corporation, Tokyo, Japan

[21] Appl. No.: 605,896

[22] Filed: Feb. 23, 1996

[30] Foreign Application Priority Data

Feb. 23, 1995 [JP] Japan .................................. 7-034894

[51] Int. Cl.$^6$ .................................................. H01L 23/34
[52] U.S. Cl. .......................... 257/713; 257/684; 257/690; 361/760
[58] Field of Search .................................... 257/684, 686, 257/703, 712, 713, 717, 753; 361/760

[56] References Cited

U.S. PATENT DOCUMENTS 5,150,198  9/1992  Ohikata et al. ............................ 357/81
5,388,029  2/1995  Moriyama ................................ 361/760

FOREIGN PATENT DOCUMENTS 63-172449  7/1988  Japan .

OTHER PUBLICATIONS

Japanese Patent Application 63-172449.

Primary Examiner—Sara W. Crane
Assistant Examiner—Douglas Wille
Attorney, Agent, or Firm—Sughrue, Mion, Zinn, Macpeak & Seas

[57] ABSTRACT

In a semiconductor device comprising a semiconductor chip, a heat radiation plate mounting the semiconductor chip thereon and having a plurality of rounded corner portions of a first radius, a ceramic substrate for mounting the heat radiation plate, and a metallize pattern formed onto the ceramic substrate for soldering the heat radiation plate onto the ceramic substrate, the metallize pattern has a plurality of rounded corner portions of a second radius. The metallize pattern is larger than the heat radiation plate in area. The first radius is greater than the second radius.

3 Claims, 5 Drawing Sheets

ID OF THE INVENTION

This invention relates to a semiconductor device comprising a heat radiation plate for radiating heat from a semiconductor chip mounted thereon and a ceramic substrate for mounting the heat radiation plate.

Generally, the semiconductor device comprises a semiconductor chip, a heat radiation plate, and a ceramic substrate. The semiconductor chip is mounted on the heat radiation plate having a plurality of corner portions. The heat radiation plate is for radiating heat generated by the semiconductor chip. The heat radiation plate is fixed to the ceramic substrate. For this purpose, a metallize pattern is formed onto the ceramic substrate. The metallize pattern has a contour similar to that of the heat radiation plate. In other words, the metallize pattern is formed so as to have the same shape as the heat radiation plate. Accordingly, the metallize pattern has a plurality of corner portions which corresponds to those of the heat radiation plate. The heat radiation plate is soldered by soldering method onto the metallize pattern.

The ceramic substrate is used for attaching the semiconductor device to a printed wiring board and for electrically connecting the semiconductor chip and electronic parts mounted on the printed wiring board. For this purpose, a plurality of input/output pin terminals are attached to the ceramic substrate and electrically connected to the semiconductor chip. The plurality of input/output pin terminals are inserted into through holes formed in the printed wiring board and are soldered thereto by the use of a soldering device such as a wave solder device.

Soldering process is carried out on one surface of the printed wiring board having a flat shape. As a result, a temperature difference occurs between the one surface and another surface opposite to the one surface. Such a temperature difference causes transformation of the printed wiring board. Namely, the printed wiring board is bent by bending stress caused by the temperature difference. This means that the plurality of input/output pin terminals are fixed on the printed wiring board having a bent shape. The printed wiring board having the bent shape turns back to the printed wiring board having the flat shape on ordinary temperature. As a result, transformation stress is added to the ceramic substrate through the plurality of input/output pin terminals. In particular, the transformation stress concentrates on each corner portion of the metallize pattern. In this event, there is a case that the metallize pattern is peeled from the ceramic substrate at each of the corner portions thereof. As a result, there is a case that the ceramic substrate has a crack.

SUMMARY OF THE INVENTION

It is therefore an object of this invention to provide a semiconductor device having improved junction construction between a heat radiation plate and a ceramic substrate.

It is another object of this invention to provide the semiconductor device which is capable of preventing peeling of a metallize pattern from the ceramic plate.

Other objects of this invention will become clear as the description proceeds.

A semiconductor device comprises a semiconductor chip, a heat radiation plate mounting the semiconductor chip thereon in order to radiate heat generated by the semiconductor chip and having a plurality of rounded plate corner portions of a first radius, a ceramic substrate for mounting the heat radiation plate, and a metallize pattern formed onto said ceramic substrate for soldering the heat radiation plate onto the ceramic substrate. The metallize pattern has a plurality of rounded pattern corner portions of a second radius. The plurality of rounded pattern corner portions correspond to the plurality of rounded plate corner portions, respectively. The semiconductor device further comprises a plurality of input/output pin terminals attached to the ceramic substrate for attaching said semiconductor device to a printed wiring board in order to electrically connect the semiconductor chip to the printed wiring board.

According to an aspect of this invention, the metallize pattern is larger than the heat radiation plate in area. The first radius is greater than the second radius.

DESCRIPTION OF THE PREFERRED EMBODIMENT

Referring to FIGS. 1 to 5, a conventional semiconductor device will be described at first in order to facilitate an understanding of this invention.

Figure 1:
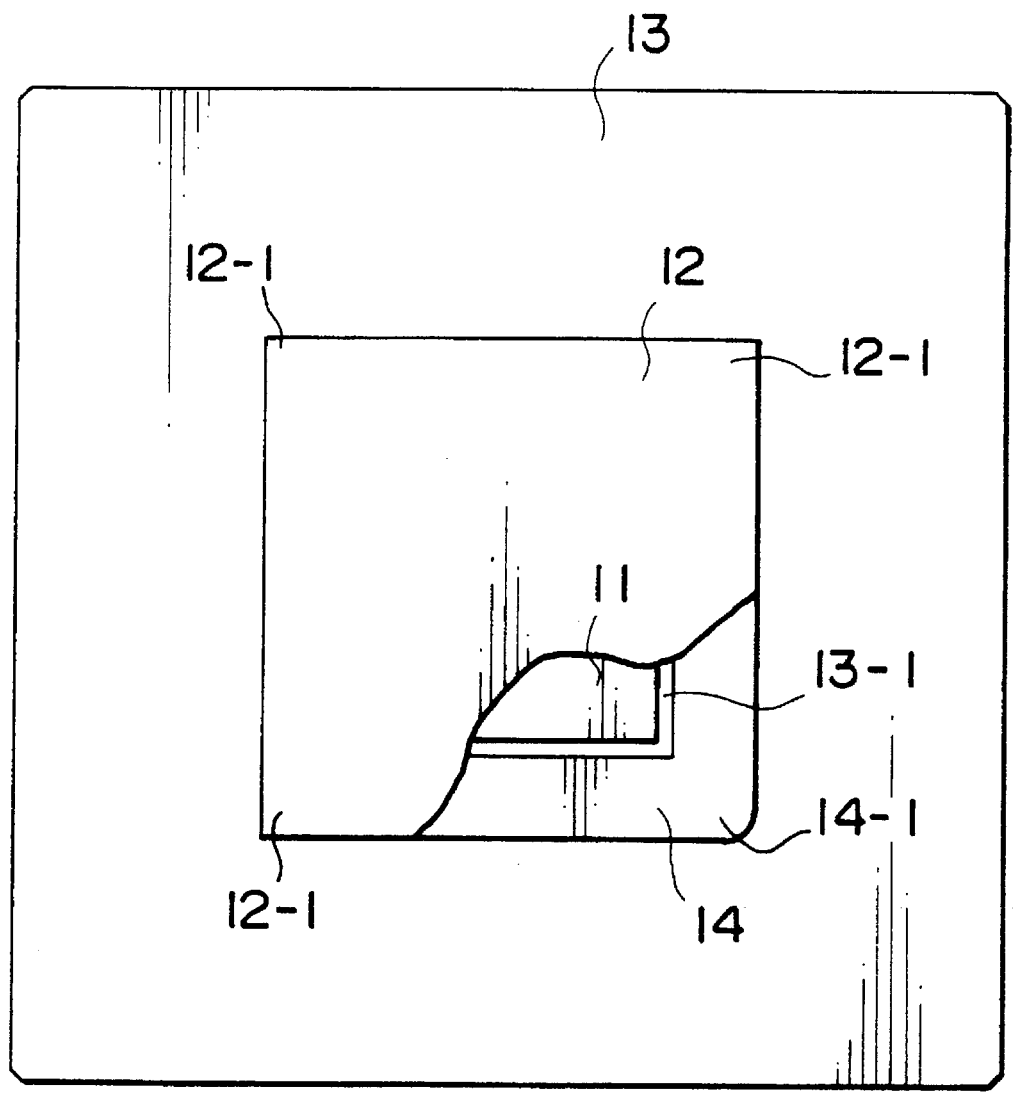
FIG. 1 is a plan view of a conventional semiconductor device which is partially cut away.
Figure 2:
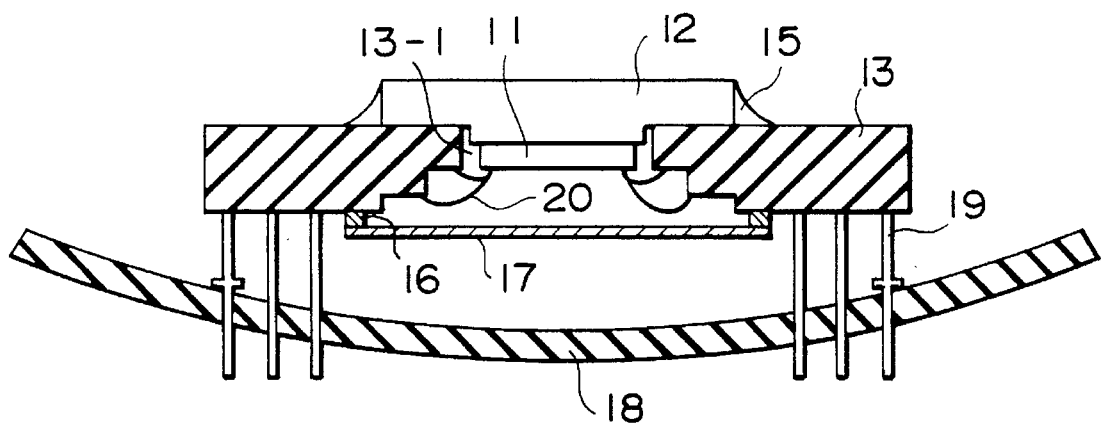
FIG. 2 is a sectional view for describing transformation of a printed wiring board in soldering process which is for mounting the semiconductor device illustrated in FIG. 1.

In FIG. 1, the semiconductor device is disclosed in Japanese Unexamined Patent Publication No. Tokkai Sho 63-172449 (172449/1988) and comprises a semiconductor chip 11, a heat radiation plate 12 made of metal, and a ceramic substrate 13. As shown in FIG. 2, the semiconductor chip 11 is mounted on the heat radiation plate 12. The ceramic substrate 13 has an aperture 13-1 for accommodating the semiconductor chip 11.

The heat radiation plate 12 has four corner portions 12-1. The heat radiation plate 12 is for radiating heat generated by the semiconductor chip 11 which is put on an active state. The heat radiation plate 12 is fixed onto an upper surface of the ceramic substrate 13. For this purpose, a metallize pattern 14 is formed around the aperture 13-1 onto the upper surface of the ceramic substrate 13. The metallize pattern 14 has a contour similar to that of the heat radiation plate 12 except that the metallize pattern 14 has four corner portions 14-1 which are rounded. The reason will be described in later. The heat radiation plate 12 is soldered by the use of soldering material 15 onto the metallize pattern 14. Thus, an upper side of the aperture 13-1 is sealed by the heat radiation plate 12. A lower side of the aperture 13-1 is sealed by the use of a seal ring 16 and a cap member 17.

The ceramic substrate 13 is used for attaching the semiconductor device to a printed wiring board 18 and for electrically connecting the semiconductor chip 11 and electronic parts mounted on the printed wiring board 18. For this purpose, a plurality of input/output pin terminals 19 are attached to the ceramic substrate 13 and electrically connected to the semiconductor chip 11 through printed wiring patterns (not shown) formed onto an under surface of the ceramic plate 13 and a plurality of bonding wires 20. The plurality of input/output pin terminals 19 are inserted into through holes formed to the printed wiring board 18 and are soldered thereto by the use of a soldering device such as a wave solder device. Such a semiconductor device is called an insert type semiconductor package.

The soldering process is carried out on one surface, namely, an under surface, of the printed wiring board 18. The printed wiring board 18 has a flat shape on ordinary temperature. However, as a result of the soldering process carried out on one surface of the printed wiring board 18, a temperature difference occurs between the one surface and another surface, namely, an upper surface opposite to the one surface. This is because high temperature soldering material is sprayed onto the one surface only. Such a temperature difference causes transformation of the printed wiring board 18 as shown in FIG. 2. Namely, the printed wiring board 18 is bent by bending stress caused by the temperature difference. This means that the plurality of input/output pin terminals 19 are fixed on the printed wiring board 18 having a bent shape.

Figure 3:
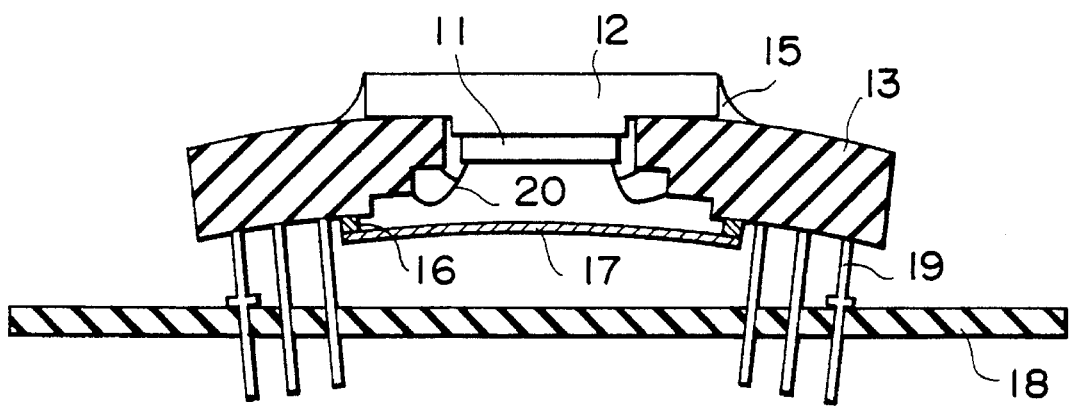
FIG. 3 is a sectional view for describing transformation of a ceramic substrate which occurs after the soldering process.

Although the printed wiring board 18 has the bent shape in the soldering process, it turns back to the printed wiring board 18 having the flat shape on ordinary temperature as shown in FIG. 3. As a result, tensile stress is applied to the ceramic substrate 13 through the plurality of input/output pin terminals 19. In particular, the tensile stress concentrates on each corner portion of the metallize pattern 14. This is because an attachment area of the plurality of input/output pin terminals 19 occupies the large part of the under surface in the ceramic substrate 13. As mentioned in conjunction with FIG. 1, the corner portions 14-1 are rounded in order to disperse the tensile stress applied to the corner portions 14-1.

However, an integration degree of semiconductor elements shows a tendency to increase. This means that the semiconductor device has an increased number of input/output pin terminals. For the reason, it is required that the printed wiring board has an increased board thickness. The more a board thickness increases, the more the tensile stress increases.

Figure 4:
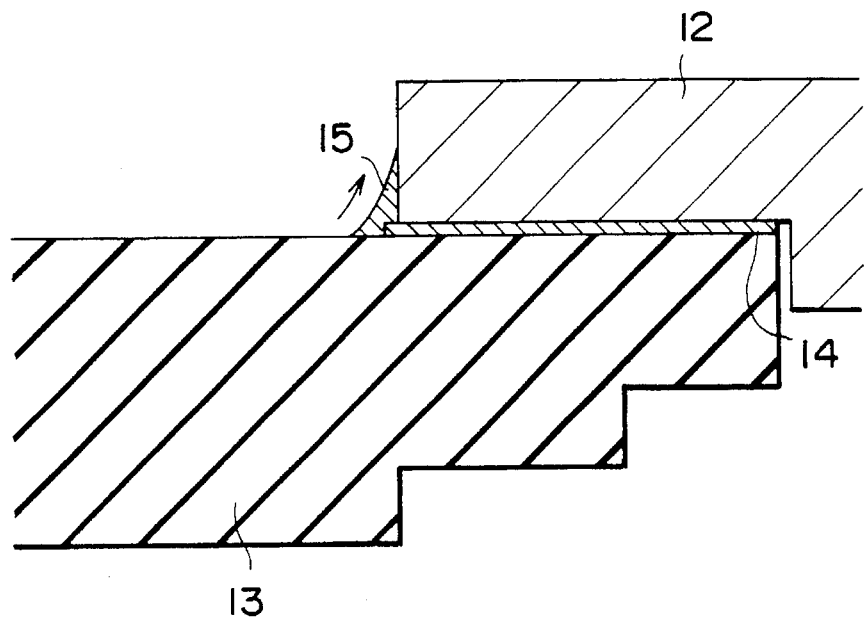
FIG. 4 is an enlarged sectional view for describing tensile stress which acts on a corner portion of a metallize pattern illustrated in FIG. 1.
Figure 5:
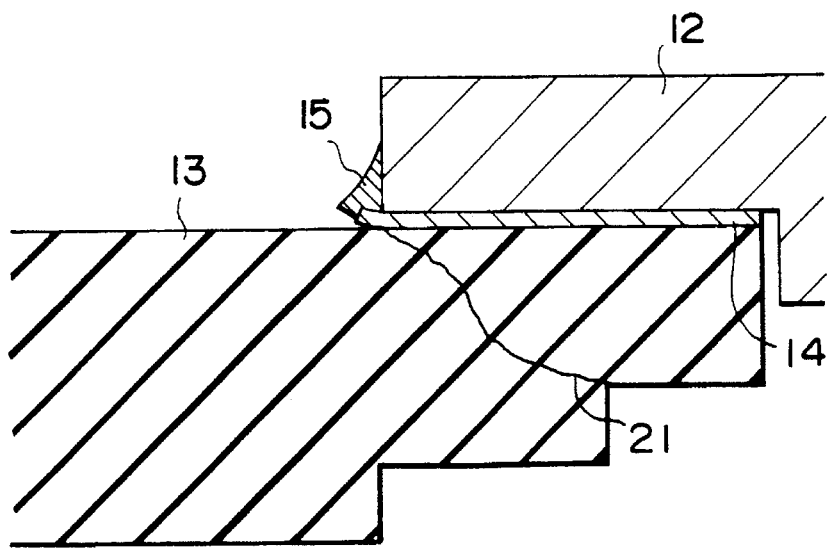
FIG. 5 is an enlarged sectional view for describing peeling of the metallize pattern illustrated in FIG. 4.

As illustrated in FIG. 4, the tensile stress acts in the direction depicted by an arrow and peels the metallize pattern 14 from the ceramic substrate 13. When the tensile stress exceeds Junction strength between the ceramic substrate 13 and the metallize pattern 14, the metallize pattern 14 is peeled from the ceramic substrate 13 at one of the corner portions 14-1. In this event, there is a case where a crack 21 is caused in the ceramic substrate 13 as shown in FIG. 5. Such a crack 21 decreases reliability of the semiconductor device and causes breaking of the printed wiring patterns formed on the ceramic substrate 13.

Figure 6:
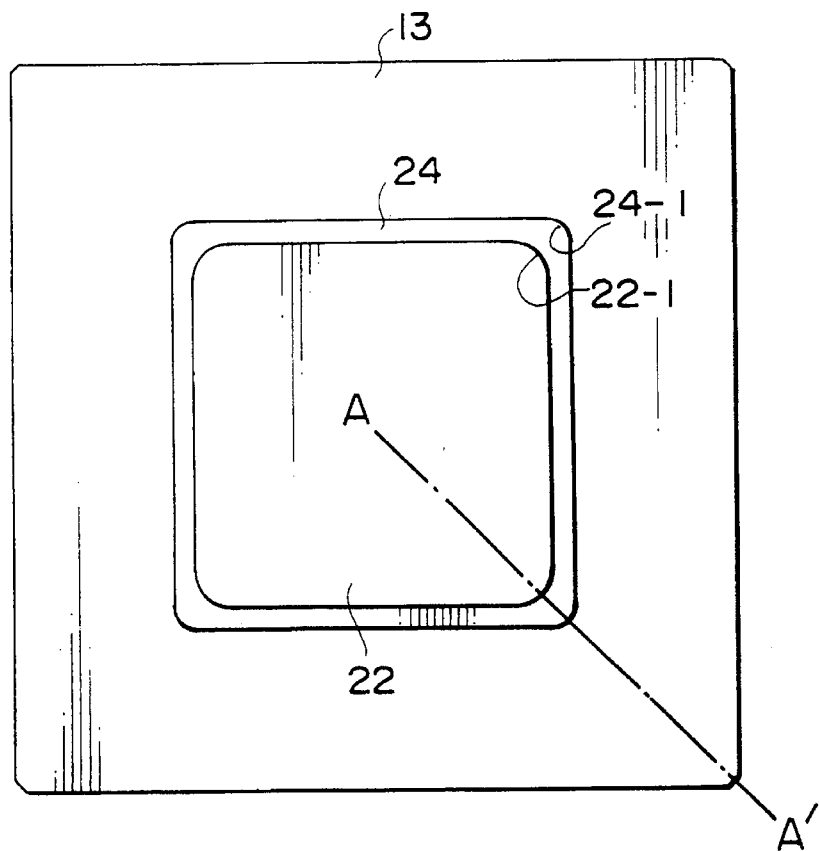
FIG. 6 is a plan view of a semiconductor device according to a first embodiment of this invention.
Figure 7:
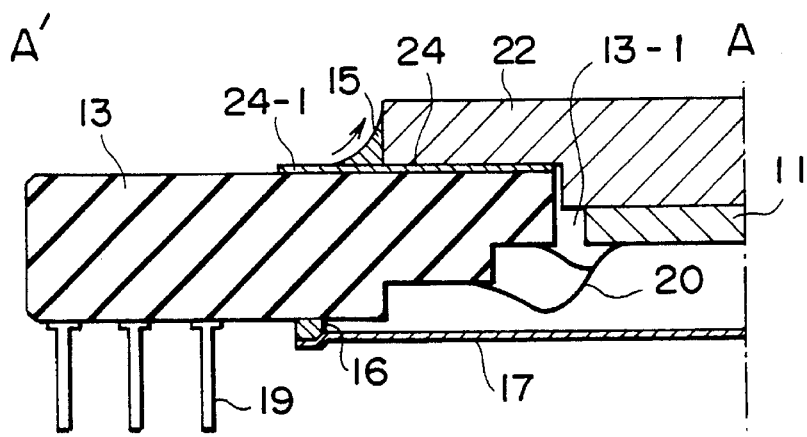
FIG. 7 is a sectional view taken along the lines AA' of FIG. 6.

Referring to FIGS. 6 and 7, description will be made as regards a semiconductor device according to a first embodiment of this invention. The semiconductor device comprises similar parts designated by like reference numerals except for a heat radiation plate 22 made of metal and a metallize pattern 24.

The heat radiation plate 22 has four rounded corner portions 22-1 of a first radius R1. The heat radiation plate 22 is for radiating heat generated by the semiconductor chip 11 which is put in an active state. The metallize pattern 24 is formed around the aperture 13-1 onto the upper surface of the ceramic substrate 13. The metallize pattern 24 is larger in area than the heat radiation plate 22 and has four rounded corner portions 24-1 of a second radius R2. As a result, each of the rounded corner portions 24-1 is apart from each of the rounded corner portions 22-1. The heat radiation plate 22 is soldered by the use of the soldering material 15 onto the metallize pattern 24. Thus, the upper side of the aperture 13-1 is sealed by the heat radiation plate 22. The lower side of the aperture 13-1 is sealed by the use of the seal ring 16 and the cap member 17. It should be noted here that the first radius R1 is greater than the second radius R2. This is for parting each of the rounded corner portions 24-1 from each of the rounded corner portions 22-1 as long as possible. For example, the first radius R1 is equal to 5 (mm) while the second radius R2 is equal to 2 (mm).

As mentioned in conjunction with FIGS. 2 and 3, the ceramic substrate 13 is used for attaching the semiconductor device to the printed wiring board and for electrically connecting between the semiconductor chip 11 and the electronic parts mounted on the printed wiring board. The plurality of input/output pin terminals 19 are attached to the ceramic substrate 13 and electrically connected to the semiconductor chip 11 through the printed wiring patterns (not shown) formed onto the under surface of the ceramic substrate 13 and the plurality of bonding wires 20. The plurality of input/output pin terminals 19 are inserted into the through holes formed to the printed wiring board and are soldered thereto by the use of the soldering device such as a wave solder device.

The soldering process is carried out on one surface of the printed wiring board. As a result of the soldering process carried out on one surface of the printed wiring board, a temperature difference occurs between the one surface and another surface. Such a temperature difference causes transformation of the printed wiring board. The plurality of input/output pin terminals 19 are fixed on the printed wiring board having the bent shape.

Although the printed wiring board has the bent shape in the soldering process, it turns back to the printed wiring board having the flat shape on ordinary temperature. As a result, the tensile stress is applied to the ceramic substrate 13 through the plurality of input/output pin terminals 19. The tensile stress concentrates on portions which correspond to the rounded corner portions 22-1 of the heat radiation plate 22. Although the tensile stress acts in the direction depicted by an arrow so as to peel one of the rounded corner portions 24-1 from the ceramic substrate 13, the tensile stress which acts onto the rounded corner portions 24-1 is reduced. This is because each of the rounded corner portions 24-1 is parted from each of the rounded corner portions 22-1. Thus, it is possible to prevent the peeling of the metallize pattern 24 at the rounded corner portions 24-1. This means that it is possible to prevent occurrence of the crack in the ceramic substrate 13.

Figure 8:
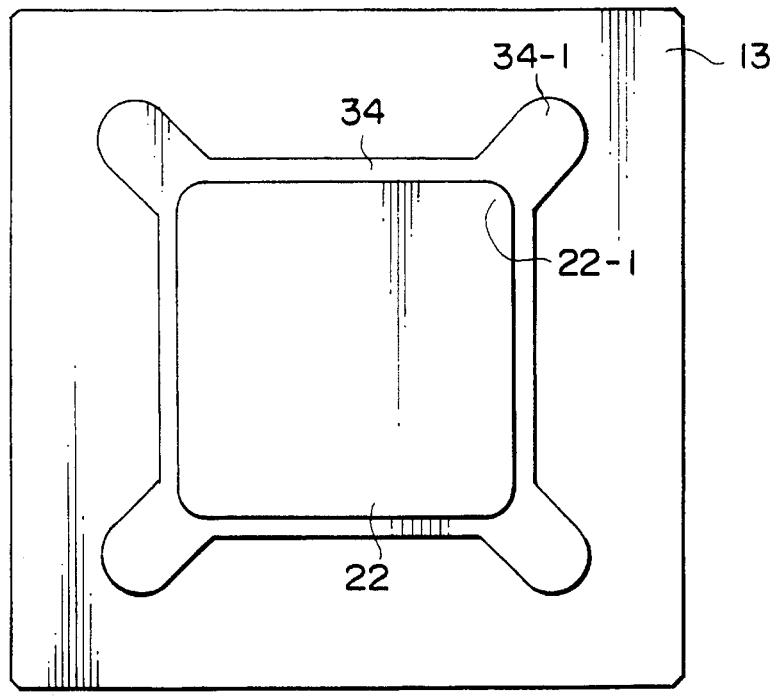
FIG. 8 is a plan view of a semiconductor device according to a second embodiment of this invention.

Referring to FIG. 8, a semiconductor device according to a second embodiment of this invention is similar to that illustrated in FIG. 6 except that a metallize pattern 34 has four rounded corner portions 341 extended in directions which are away from the rounded corner portions 22-1. In other words, each of the rounded corner portions 34-1 is radially extended. Each of the rounded corner portions 34-1 is further parted from each of the rounded corner portions 22-1 relative to the case illustrated in FIG. 6. Accordingly, the tensile stress which serves to the rounded corner portions 34-1 can be further reduced. If the metallize pattern 34 has firing shrinkage as a result of firing of the ceramic substrate 13, the soldering material effectively formed on the rounded corner portions 34-1 without overflow.

Figure 9:
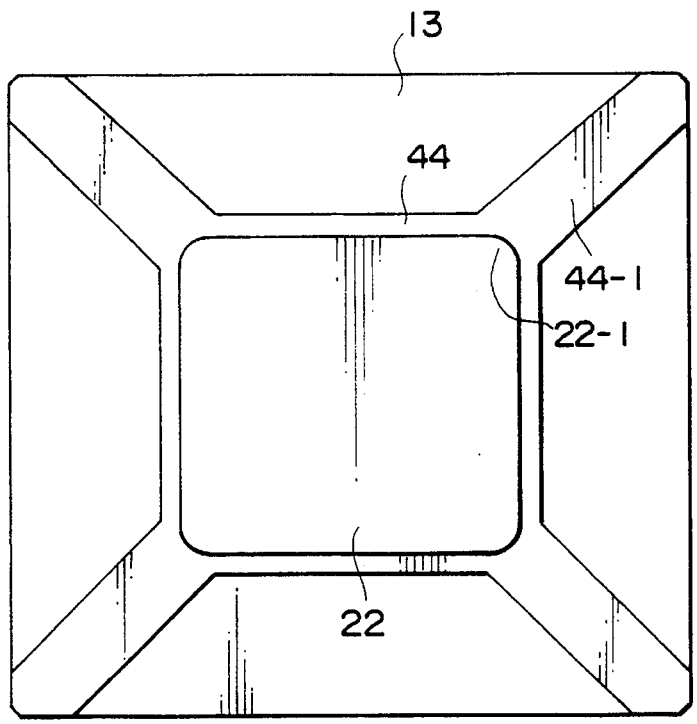
FIG. 9 is a plan view of a semiconductor device according to a third embodiment of this invention.

Referring to FIG. 9, a semiconductor device according to a third embodiment of this invention is similar to that illustrated in FIG. 7 except that a metallize pattern 44 has four corner portions 44-1 extended to four corners of the ceramic substrate 13. According to the third embodiment, it is possible to increase reduction effect of the tensile stress which serves to the corner portions 44-1.

What is claimed is:

1. A semiconductor device comprising a semiconductor chip, a heat radiation plate mounting said semiconductor chip thereon in order to radiate heat generated by said semiconductor chip and having a plurality of rounded plate corner portions of a first radius, a ceramic substrate for mounting said heat radiation plate, and a metallize pattern formed onto said ceramic substrate for soldering said heat radiation plate onto said ceramic substrate, said metallize pattern having a plurality of rounded pattern corner portions of a second radius, said plurality of rounded pattern corner portions corresponding to said plurality of rounded plate corner portions, respectively, said semiconductor device further comprising a plurality of input/output pin terminals attached to said ceramic substrate for attaching said semiconductor device to a printed wiring board in order to electrically connect said semiconductor chip to said printed wiring board, wherein:

said metallize pattern is larger than said heat radiation plate in area, said first radius being greater than said second radius.

2. A semiconductor device comprising a semiconductor chip, a heat radiation plate mounting said semiconductor chip thereon in order to radiate heat generated by said semiconductor chip and having a plurality of rounded plate corner portions, a ceramic substrate for mounting said heat radiation plate, and a metallize pattern formed onto said ceramic substrate for soldering said heat radiation plate onto said ceramic substrate, said metallize pattern having a plurality of pattern corner portions which correspond to said plurality of rounded plate corner portions, respectively, said semiconductor device further comprising a plurality of input/output pin terminals attached to said ceramic substrate for attaching said semiconductor device to a printed wiring board in order to electrically connect said semiconductor chip to said printed wiring board, wherein:

said metallize pattern is larger than said heat radiation plate in area, said plurality of pattern corner portions being extended in directions which are away from said plurality of plate corner portions.

3. A semiconductor device as claimed in claim 2, wherein said plurality of pattern corner portions being extended to corners of said ceramic substrate.

* * * * *